United States Patent [19]

Nishino et al.

[11] Patent Number: 5,210,449
[45] Date of Patent: May 11, 1993

[54] EDGE TRIGGERED TRI-STATE OUTPUT BUFFER

[75] Inventors: Kiyoshi Nishino, Yamato; Yasumasa Tomonaga, Sagamihara, both of Japan

[73] Assignee: International Business Machines Corporation, Armonk, N.Y.

[21] Appl. No.: 760,622

[22] Filed: Sep. 16, 1991

[30] Foreign Application Priority Data

Oct. 15, 1990 [JP] Japan .................................. 2-273510

[51] Int. Cl.⁵ ...................... H03K 19/00; H03K 17/16
[52] U.S. Cl. .................................... 307/473; 307/443; 307/451
[58] Field of Search ................ 307/443, 451, 473, 481

[56] References Cited

U.S. PATENT DOCUMENTS

| | | | |
|---|---|---|---|
| 4,529,895 | 7/1985 | Garverick et al. | 307/473 |
| 4,570,091 | 2/1986 | Yasuda et al. | 307/473 |
| 4,777,389 | 10/1988 | Wu et al. | 307/451 |
| 4,933,579 | 6/1990 | Isobe et al. | 307/443 |
| 5,047,673 | 9/1991 | Kaneko | 307/473 |

*Primary Examiner*—Edward P. Westin
*Assistant Examiner*—Benjamin D. Driscoll
*Attorney, Agent, or Firm*—Harold Huberfeld

[57] ABSTRACT

A tri-state circuit is provided having first and second input lines for each receiving an input signal thereon. A circuit output line is connected to and controlled by an output switching circuit. A control circuit is responsive to both input signals to cause the switching circuit to adopt one of three states wherein the switching circuit delivers a high logic signal to the output line in a first state, a low logic signal in a second state, and no output signal in a third state. The circuit includes circuitry connected to the switching circuit and the output line for reducing the current in the output line to substantially zero over a transient period when the switching circuit is in the third state. The control circuit further includes a delay circuit for substantially reducing the transient period thereby minimizing the amount of current flowing in the output line when the circuit is in the third state.

8 Claims, 2 Drawing Sheets

DATA SIGNAL

INSTRUCTION TO PLACE OUTPUT LINE 10 IN HIGH-IMPEDANCE STATE $\overline{EN}$ SIGNAL DELAY SIGNAL OF $\overline{EN}$ SIGNAL REVERSED SIGNAL OF DELAYED $\overline{EN}$ SIGNAL

OUTPUT SIGNAL FROM AND GATE 23

OUTPUT SIGNAL FROM NOR GATE 22

OUTPUT SIGNAL FROM OR GATE 15

OUTPUT LINE 10 PLACE IN HIGH-IMPEDANCE STATE

OUTPUT SIGNAL FROM AND GATE 16

EDGE TRIGGERED TRI-STATE OUTPUT BUFFER

BACKGROUND OF THE INVENTION

1. Field of the Invention

The invention relates generally to tri-state circuit and more particularly to an integrated high-speed tri-state circuit having low power consumption.

2. Related Art

FIG. 1 shows an integrated circuit with a conventional pull-up type tri-state circuit. In the figure, an input of an inverter 13 is connected to a data line 11 and its output is connected to one input of an OR gate 15 as well as one input of an AND gate 16. An input of an inverter 14 is connected to an enable ($\overline{EN}$) line 12 as well as the other input of the OR gate 15 and its output is connected to the other input of the AND gate 16. The gate of a P-channel enhancement-type MOSFET (hereafter, called P-type FET) 17 is connected to an output of the OR gate 15. A drain terminal of the P-type FET 17 is connected so that a first source voltage Vc is applied, and its source terminal is connected to a drain terminal of a N-channel enhancement-type MOSFET (hereafter, called N-type FET) 18. A gate terminal of the N-type FET 18 is connected to an output of the AND gate 16 and its source terminal is connected to a second source voltage or reference potential (ground potential). A point of connection of the source terminal of the P-type FET 17 with the drain terminal of the N-type FET 18 is connected to an output line 10. One end of a pull-up resistance 19 is connected to the first source voltage Vc and the other end of the resistance 19 is connected to the output line 10. The output line 10 is connected to an input circuit 21 to a next-stage CMOS circuit. In the CMOS circuit, the input to the next-stage CMOS circuit becomes unsteady if the output line 10 is in a floating state. This is the reason the pull-up resistance 19 is provided.

The operation of the circuit illustrated in FIG. 1 will now be described. If an $\overline{EN}$ signal at a logic level 1 (or high logic signal) is provided to the enable line 12, an output signal from the OR gate 15 always becomes a logic level 1 and thus the MOSFET 17 is always rendered non-conductive. On the other hand, an output signal from the AND gate 16 is always at the logic level 0 (or low logic level signal) and thus the MOSFET 18 is always rendered non-conductive. From the above, when an $\overline{EN}$ signal is at the logic level 1, both FET 17 and FET 18 are always non-conductive, regardless of the value of a data signal provided to the data line 1. That is, when an $\overline{EN}$ signal is at the logic level 1, the output line 10 is put in a high impedance state.

When an $\overline{EN}$ signal at the logic level 0 is supplied to the enable line 12, a logic level 1 signal on data line 11 causes an output signal from the OR gate 15 to assume the logic level 0 and an output signal from the AND gate 16 to assume the logic level 0. Accordingly, the P-type FET 17 rendered conductive and, on the other hand, the N-type FET 18 is rendered non-conductive. Thus, this causes the output signal on line 10, to become the logic level 1.

If an $\overline{EN}$ signal at the logic level 0 is supplied to the enable line 12, a logic level 0 signal on data line 11 causes an output signal from the OR gate 15 to assume the logic level 1 and an output signal from the AND gate 16 to assume the logic level 1. Accordingly, the P-type FET 17 is rendered non-conductive and, on the other hand, the N-type FET 18 is rendered conductive. Thus, this causes the output signal on line 10 to become the logic level 0.

As is obvious from the above, this known integrated circuit takes three states (1 level state, 0 level state, and high impedance state) in response to the enable signal.

In the above conventional integrated circuit, when a data signal at the logic level 0 is supplied to the data line 11, an output signal at the logic level 0 is provided to the output line 10. In a state where a data signal at the logic level 0 has been given to the data line 11, if an $\overline{EN}$ signal applied to the enable line 2 changes from the logic level 0 to the logic level 1, the output circuit assumes a high-impedance state. Accordingly, floating capacitance in the output line 10 gradually charges up, through the pull-up resistance 19, to the source voltage level Vc. In such a state, the output signal rises, for example, in 500-600 ns to 5-6 $\mu$s in accordance with the time constant determined by the pull-up resistance 19 and the above floating capacity, to the source voltage level Vc from the level 0. Since the output signal does not rise abruptly in such a state, during this transient period, a through current continues to flow in the next-stage CMOS circuit and thereby power is consumed. Furthermore if the data signal on line 11 involves many logic level 0 signals, the above-described problem is exascerbated.

The present invention is intended to solve such a problem, in particular, to provide a high-speed tri-state integrated circuit of low power consumption.

SUMMARY OF THE INVENTION

Accordingly, a tri-state circuit is provided having first and second input lines for each receiving an input signal thereon. A circuit output line is connected to and controlled by an output switching circuit. A control circuit is responsive to both input signals to cause the switching circuit to adopt one of three states wherein the switching circuit delivers a high logic signal to the output line in a first state, a low logic signal in a second state, and no output signal in a third state. The circuit includes circuitry connected to the switching circuit and the output line for reducing the current in the output line to substantially zero over a transient period when the switching circuit is in the third state. The control circuit further includes a delay circuit for substantially reducing the transient period thereby minimizing the amount of current flowing in the output line when the circuit is in the third state.

Other advantages and novel features of the present invention will become apparent from the following detailed description of the invention when considered in conjunction with the accompanying drawings.

DESCRIPTION OF THE PREFERRED EMBODIMENT

Figure 1:
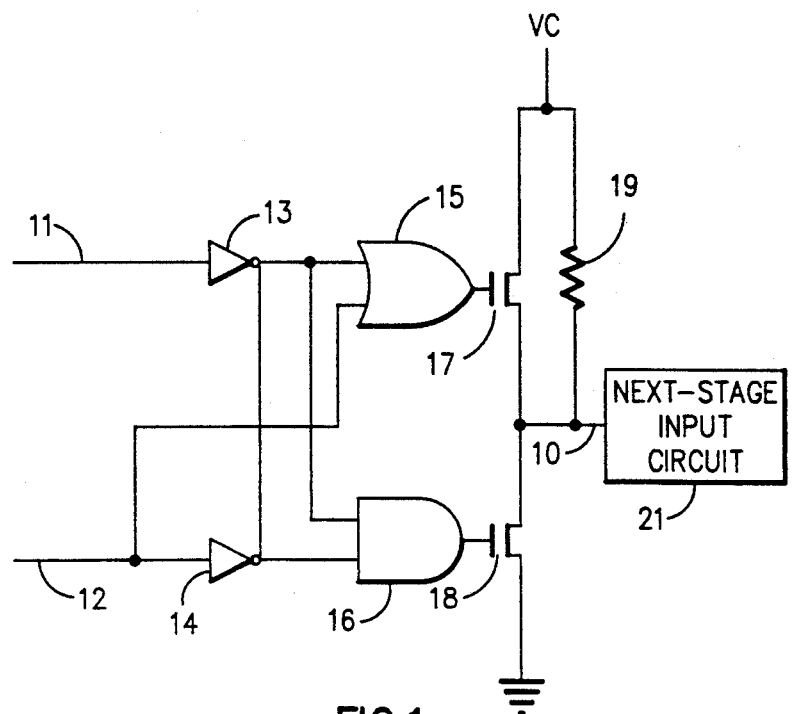
FIG. 1 shows a schematic diagram of a known tri-state circuit.
Figure 2:
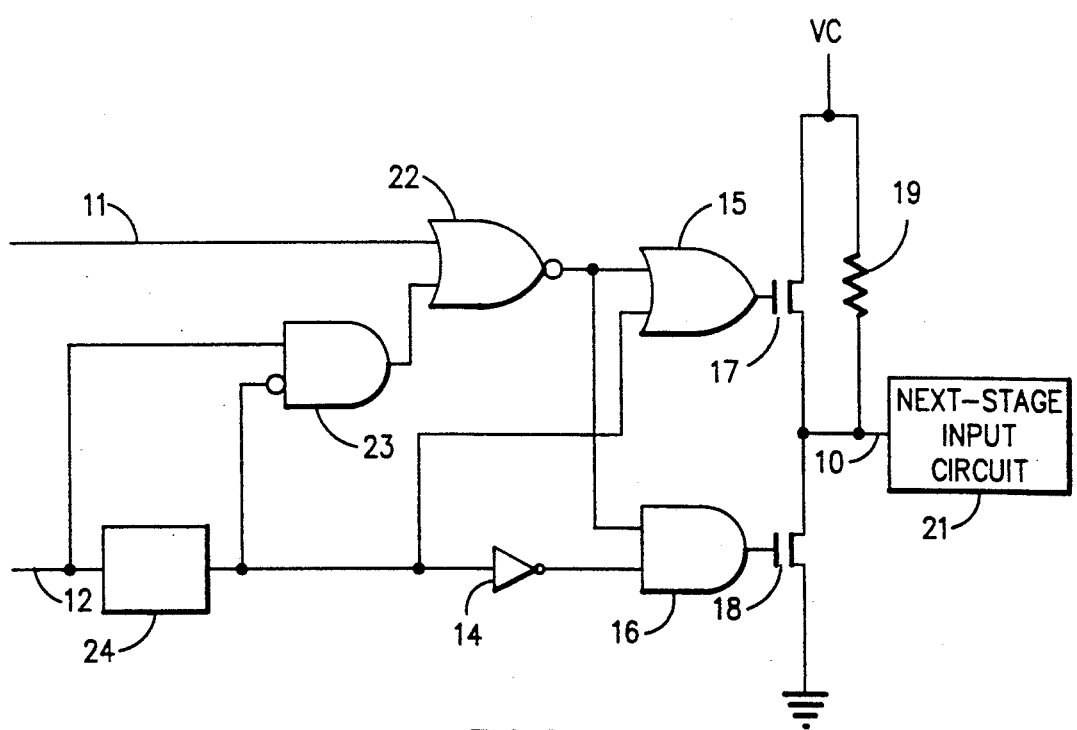
FIG. 2 shows a schematic diagram of the tri-state circuit of the present invention.

FIG. 2 is a schematic diagram showing an integrated circuit having a pull-up type tri-state circuit in an embodiment of the present invention. In FIG. 2 like components are identified by the same numerals as are utilized to identify those components in FIG. 1. In FIG. 2, one input of a NOR gate 22 is connected to a data line 11 and the other input of the NOR gate 12 is connected to an output of an AND gate 23. Also, one input of the AND gate 13 is connected to an enable line 12 and the other inverted input is connected, through a delay circuit 24, to the enable line 12. Likewise, an input of an inverter 24 is connected, through the delay circuit 24, to the enable line 12.

Except for the above, the circuit shown in FIG. 2 is the same as the circuit shown in FIG. 1.

The operation of the circuit of FIG. 2 is described herein by using waveforms in respective sections of the circuit as shown in FIGS. 3A-3H as follows.

Figure 3A:
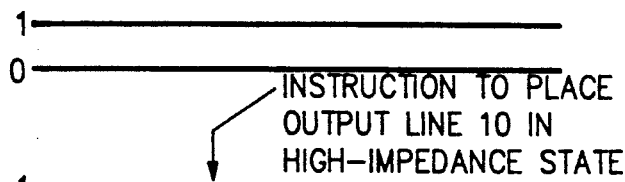
FIGS. 3A-3H show waveforms present in sections of the circuit illustrated in FIG. 2 under various operating conditions.
Figure 3B:
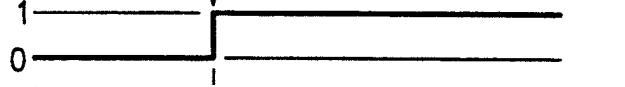
Figure 3C:
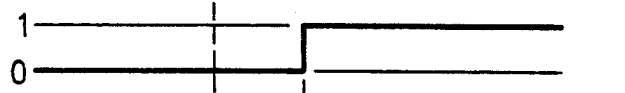
Figure 3D:
Figure 3E:
Figure 3F:
Figure 3G:
Figure 3H:
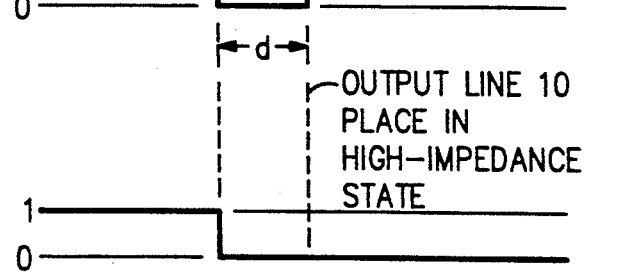

First, considerations will be given to a case where a data signal of logic level 0 (shown by a solid line in FIG. 3A) is applied to the data line 11 to which one input of the NOR gate 22 is connected. Simultaneously a signal which changes from logic level 0 to logic level 1 (shown by in FIG. 3B) is applied to the $\overline{EN}$ line 12 to which the other input of the NOR gate 12 is indirectly connected. A point at which the $\overline{EN}$ signal changes from logic level 0 to logic level 1 indicates a time when an instruction indicating high impedance state in the output line 10 is issued. When the above input signals are applied, an $\overline{EN}$ signal applied to the enable line 12 is delayed by a predetermined period of time, for example, several nanoseconds (ns), by means of the delay circuit 24 and a delayed signal (shown in FIG. 3C) is inputted to one of the inputs of the OR gate 15 as well as to the inverter 14 to produce an inverted signal (shown by in FIG. 3D. The AND gate 23 receives the above $\overline{EN}$ signal (FIG. 3B) and the inverted $\overline{EN}$ signal (FIG. 3D) as delayed (FIG. 3C) to produce an output signal (FIG. 3E). Also, the NOR gate 22 receives the data signal (FIG. 3A) and the AND gate 23 output signal (FIG. 3E) to produce an inverted output signal (FIG. 3F). The inverted output signal from NOR gate 22 is applied to one input of the OR gate 15. The other input of the OR gate 15 receives the inverted and delayed $\overline{EN}$ signal (FIG. 3D). The OR gate 15 then produces an output signal (FIG. 3G). The OR gate 15 output signal is applied to the control terminal of the P-type FET 17 to render the P-type FET 17 conductive during a period of time d and nonconductive thereafter. On the other hand, the AND gate 16 receives the output signal from the NOR gate 22 and the output signal from the inverter 14 to produce an output signal (in FIG. 3H) which is applied to the control terminal of N-type FET 18. Since the AND gate 16 output signal is at logic level 0, the N-type FET 18 is rendered nonconductive.

Thus, before both the P-type FET 17 and the N-type FET 18 are rendered nonconductive only the P-type FET 17 is rendered conductive and the output line 10 is abruptly charged to the source voltage Vc level. Then both the P-type FET 17 and the N-type FET 18 are rendered nonconductive to place the output line 10 in a high-impedance state.

By performing the operation, the through current problem described with respect to the FIG. 1 circuit can be completely removed and thus power consumption can be decreased.

In the above embodiment, an integrated circuit provided with a pull-up type tri-state circuit has been described. However, an integrated circuit provided with a pull-down type tri-state circuit is the same as the integrated circuit of the embodiment except that the integrated circuit having the pull-down type tri-state circuit places an output line in a high-impedance state after the output line has been abruptly discharged through a pull-down resistance. Accordingly, the present invention contemplates such a variation of the preferred embodiment described herein.

According to the invention, when an enable signal EN is switched from a logic level 0 to a logic level 1, before both a P-type FET and a N-type FET in the output switching circuit are rendered nonconductive, the P-type FET is rendered conductive during a predetermined period of time, thus abruptly charging the output line to a source voltage level. Subsequently, both the P-type FET and the N-type FET are rendered nonconductive to place the output line in a high-impedance state and to substantially completely remove the above-mentioned through current. Thereby power consumption can be decreased, the amount of heat generated is held to a low level even though the number of gates increases, and thus a plastic-packaged, economical integrated circuit can be provided.

While there has been described what is at present considered to be the preferred embodiment of the present invention, it will be obvious to those skilled in the art that various changes or modifications may be made therein, without departing from the invention, and it is, therefore, aimed in the appended claims to cover all those changes and modifications as follow in the true spirit and scope of the invention.

We claim:

1. A tri-state circuit comprising:
    a first input line for receiving a first input signal;
    a second input line for receiving a second input signal;
    an output switching circuit;
    an output line connected to said output switching circuit;
    control means responsive to said first and second input signals for causing said switching circuit to adopt one of three states wherein said switching circuit delivers a high logic signal to said output line in a first state, wherein said switching circuit delivers a low logic signal to said output line in a second state, and wherein said switching circuit places said output line in a third state, said third state being a high-impedance state; and
    means connected to said switching circuit and said output line for reducing the current in said output line to substantially zero over a transient period when said switching circuit is in said third state, said control means including means for substantially reducing said transient period thereby minimizing the amount of current flowing in said output line when said switching circuit is in said third state.

2. A circuit as set forth in claim 1 wherein said means for substantially reducing said transient period includes a delay circuit for causing said control means to delay the transition of said switching circuit from either said first state or said second state to said third state.

3. A circuit as set forth in claim 2 wherein said switching circuit includes first and second transistors connected in series, each having a control terminal, wherein said current reducing means includes first and second supply voltages connected to said first and second transistors, and a resistor connected between said first supply voltage and said output line, and wherein said control means includes an OR gate connected to said first transistor control terminal and a first AND gate connected to said second transistor control terminal.

4. A circuit as set forth in claim 3 wherein said control means further includes a NOR gate having a first input connected to said first input line and an output connected to a first input of said OR gate and said first AND gate, a second AND gate having a first input connected to said second input line, an inverted input connected to the output of said delay circuit, and an output connected to a second input of said NOR gate, and an inverter having its input connected to the output of said delay circuit and its output connected to sa second input of said first AND gate, an input of said delay circuit being connected to said second input line and a second input of said OR gate connected to the output of said delay circuit.

5. A circuit as set forth in claim 1 wherein said first and second transistors are complementary MOSFETs.

6. A circuit as set forth in claim 1 wherein said first input signal is a data signal.

7. A circuit as set forth in claim 1 wherein said second input signal prevents an output signal from occurring on said output line.

8. A circuit as set forth in claim 1 wherein said circuit is an integrated circuit.

* * * * *